United States Patent
Qian

(10) Patent No.: US 9,570,154 B2
(45) Date of Patent: Feb. 14, 2017

(54) DUAL-PORT SRAM TIMING CONTROL CIRCUIT WHICH CAN REDUCE THE OPERATIONAL POWER CONSUMPTION OF SRAM WITHOUT AFFECTING THE READ RELIABILITY

(71) Applicant: SHANGHAI HUAHONG GRACE SEMICONDUCTOR MANUFACTURING CORPORATION, Shanghai (CN)

(72) Inventor: Yijun Qian, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/978,581

(22) Filed: Dec. 22, 2015

(65) Prior Publication Data

US 2016/0211011 A1 Jul. 21, 2016

(30) Foreign Application Priority Data

Jan. 19, 2015 (CN) .......................... 2015 1 0024022

(51) Int. Cl.
*G11C 11/00* (2006.01)
*G11C 7/10* (2006.01)
(Continued)

(52) U.S. Cl.
CPC .......... *G11C 11/418* (2013.01); *G11C 7/1075* (2013.01); *G11C 7/12* (2013.01); *G11C 8/16* (2013.01); *G11C 7/222* (2013.01)

(58) Field of Classification Search
USPC ...................... 365/154, 156, 189.05, 189.07, 189.08, 365/230.05, 230.08, 233.1, 233.11
See application file for complete search history.

(56) References Cited

U.S. PATENT DOCUMENTS 6,333,872 B1 * 12/2001 Ouellette ............... G11C 29/14
365/230.05
8,295,099 B1 * 10/2012 Yachareni ................ G11C 8/16
365/230.05

(Continued)

*Primary Examiner* — Trong Phan
(74) *Attorney, Agent, or Firm* — MKG, LLC

(57) ABSTRACT

A dual-port SRAM timing control circuit, with three NMOS transistors connected in series respectively between ground and nodes of the two bit lines to which the cell structure corresponds. The gates of the NMOS transistors are connected to a corresponding wordline, a pulse signal and a timing control signal, respectively. The each pulse signals are formed by a corresponding clock signal inputted into a first pulse generator, respectively. An address signal, after passing through an address latch, is inputted into an address comparator for comparison, with the address comparison result outputted to a timing control signal generator; and the pulse signal, after undergoing an AND operation, is inputted into the timing control signal generator, with a timing control signal outputted. When the two address signals are the same, the address comparison result is 1; when the two address signals are not the same, the address comparison result is 0; when the AND result of the two pulse signals is 0, the timing control signal is 1; when the AND result of the two pulse signals is 1, the timing control signal is an inverting signal of the address comparison result. The present invention can reduce the operational power consumption of SRAM without affecting the read reliability.

4 Claims, 5 Drawing Sheets

(51) Int. Cl.
*G11C 7/06* (2006.01)
*G11C 8/00* (2006.01)
*G11C 8/18* (2006.01)
*G11C 11/418* (2006.01)
*G11C 7/12* (2006.01)
*G11C 8/16* (2006.01)
G11C 7/22 (2006.01)

(56) References Cited

U.S. PATENT DOCUMENTS

| | | | |
|---|---|---|---|
| 8,665,636 B2 * | 3/2014 | Fukuda | G11C 7/222 |
| | | | 365/154 |
| 9,129,707 B2 * | 9/2015 | Lin | G11C 11/419 |
| 9,245,615 B2 * | 1/2016 | Wu | G11C 8/16 |

* cited by examiner

DUAL-PORT SRAM TIMING CONTROL CIRCUIT WHICH CAN REDUCE THE OPERATIONAL POWER CONSUMPTION OF SRAM WITHOUT AFFECTING THE READ RELIABILITY

FIELD OF THE INVENTION

The present invention relates to design of a semiconductor integrated circuit, particularly to a timing control circuit of dual-port static random access memory (SRAM).

BACKGROUND OF THE INVENTION

A dual-port SRAM can read and write the SRAM cell through two ports, respectively, each of the ports having a corresponding set of address bus, data bus and control signals. The two ports can read the SRAM cells of the same address simultaneously, and can also read different SRAM cells, respectively. In the two cases the read currents are different, which will be the minimal when the two ports read the SRAM cells of the same address simultaneously. As shown in FIG. 1, it is a read-write schematic diagram of an existing dual-port SRAM. A bit line BLA and a wordline WLA correspond to a first port, and a bit line BLB and a wordline WLB correspond to a second port. $V_{read}$ represents the read voltage.

When the two ports read the same address simultaneously, the MOS transistors of the same address, M102a and M102b, are both opened, their read currents being half of the current of the MOS transistor M101, respectively, with the read current formula being the following formula (1). When one address is only read by one port, only one of the MOS transistors of the same address, M102a and M102b, is opened, its read current being equal to the current of the MOS transistor M101, with the read current formula being the following formula (2).

$$I_{read,dual} = K_{pg}(V_{DD} - V_{read,dual} - V_{tpg})^2 = \frac{1}{2}K_{pd}\left(V_{DD} - V_{tpd} - \frac{1}{2}V_{read,dual}\right) \cdot V_{read,dual} \quad (1)$$

$$I_{read,single} = K_{pg}(V_{DD} - V_{read,single} - V_{tpg})^2 = K_{pd}\left(V_{DD} - V_{tpd} - \frac{1}{2}V_{read,single}\right) \cdot V_{read,single} \quad (2)$$

In the above formulas (1) and (2), the MOS transistor M101 works in a resistive region, the MOS transistors M102a or M102b work in a saturation region, $I_{read,dual}$ and $V_{read,dual}$ respectively represent the read current and the read voltage when the two ports read the same address simultaneously, $I_{read,single}$ and $V_{read,single}$ respectively represent the read current and the read voltage when only one port reads the same address, Kpg represents the coefficient of the current formula of the MOS transistor M102a or M102b, VDD represents the power supply voltage, Vtpg represents the threshold voltage of the MOS transistor M102a or M102b, Kpd represents the coefficient of the current formula of the MOS transistor M101, and Vtpd represents the threshold voltage of the MOS transistor M101.

The SRAM cell structure (cell) has three operating states, which are "Select", "Half Select" and "Static", respectively. The power consumption models of the three states are respectively as follows:

Select: The Bit cell discharges a bit line capacitor $C_{BL}$, with the power consumption expressed by the following formula (3):

$$P_{Select} = I_{read} \cdot T_{wl} \cdot Vdd \cdot f \quad (3)$$

In the formula (3), $P_{select}$ represents the power consumption of the SRAM cell structure in the select state, $I_{read}$ represents the read current of the SRAM cell structure, $T_{wl}$ represents the duration during which the wordline is at a high level during the read operation, and f represents frequency.

Half Select: For a discharge path within a certain time, the power consumption can be expressed by the following formula (4):

$$P_{half} = I_{pre} \cdot T_{wl} \cdot Vdd \cdot f \quad (4)$$

In the formula (4), $P_{half}$ represents the power consumption of the SRAM cell structure in the selecting state, and $I_{pre}$ represents the precharged current of the SRAM cell structure.

Static: The power consumption is determined by the leakage (Leakage).

$T_{wl}$ is determined by the required voltage difference $\Delta V_{BL}$ of the desired bit line, and can be expressed by the following formula (5):

$$T_{WL} = \frac{C_{BL} \cdot \Delta V_{BL}}{I_{read}} \quad (5)$$

In formula (5), $\Delta V_{BL}$ represents the voltage difference of the bit line, that is the difference between the voltages of the same bit line before and after being read.

It can be known from the formulas (3)-(5) that, the operational power consumption of the SRAM cell can be reduced by reducing $T_{wl}$, which can be realized by increasing the discharge speed of the bit line. Therefore, it has become a research subject of the present invention that how to dynamically adjust $T_{wl}$ through change of the operational address of the dual ports, and finally reduce the operational power consumption of the SRAM cell.

BRIEF SUMMARY OF THE INVENTION

A technical problem to be solved by the present invention is to provide a dual-port SRAM timing control circuit, which can reduce the operational power consumption of SRAM without affecting the read reliability.

In order to solve the above technical problem, the dual-port SRAM timing control circuit provided by the present invention is as follows:

A first NMOS transistor, a second NMOS transistor and a third NMOS transistor are connected in series between ground and a node of the first bit line to which each SRAM cell structures correspond, and a fourth NMOS transistor, a fifth NMOS transistor and a sixth NMOS transistor are connected in series between ground and a node of the second bit line to which the structures of each SRAM cell correspond.

The gate of the first NMOS transistor is connected to a first wordline, the gate of the fourth NMOS transistor is connected to a second wordline, the gate of the second NMOS transistor is connected to a first pulse signal, the gate of the fifth NMOS transistor is connected to a second pulse signal, and both the gate of the third NMOS transistor and the gate of the fifth NMOS transistor are connected to a timing control signal.

A first clock signal and a first address signal are inputted from a first port, and a second clock signal and a second address signal are inputted from a second port.

The first clock signal and the second clock signal are inputted into the first pulse generator, forming the first pulse signal and the second pulse signal, respectively; the falling edge of the first pulse signal is generated by a plurality of the SRAM cells discharging the first bit line, and the falling edge of the second pulse signal is generated by a plurality of the SRAM cells discharging electricity toward the second bit line, the rising edge of the first pulse signal being generated at the rising edge of the first clock signal, the rising edge of the second pulse signal being generated at the rising edge of the second clock signal.

The first address signal and the second address signal, after being latched by an address latch, are inputted into an address comparator for comparison, which outputs the address comparison result to a timing control signal generator; the first pulse signal and the second pulse signal, after undergoing an AND operation, are inputted into the timing control signal generator, which outputs the timing control signal.

When the first address signal is identical with the second address signal, the address comparison result is 1; when the first address signal and the second address signal are different, the address comparison result is 0.

When the AND result of the first pulse signal and the second pulse signal is 0, the timing control signal is 1; when the AND result of the first pulse signal and the second pulse signal is 1, the timing control signal is an inverting signal of the address comparison result.

Thus, the present invention uses an address comparator to compare the signals in different addresses. When the address signals are different, the time control signal will adjust the clock pulse width within the SRAM, so as to reduce the operational power consumption.

As a further improvement, the first clock signal and the second clock signal are different in frequency and asynchronous in phase.

As a further improvement, the address comparator includes a plurality of XOR gates, and a plurality of NOR gates.

Each XOR gates perform an XOR operation on each same bits of the first address signal and the second address signal, respectively, and output an address XOR signal composed of the XOR value of each bits.

Each NOR gates perform an NOR operation on more than two bits of the address XOR signal, respectively, and output the corresponding NOR operation result.

Perform an AND operation on the NOR operation result outputted by each NOR gates to form the address comparison result.

As a further improvement, the timing control signal generator includes a transmission gate composed of a first PMOS transistor and a seventh NMOS transistor, whose drains are both connected to the address comparison result, the gate of the first PMOS transistor being connected to an inverting signal of an AND signal of the first pulse signal and the second pulse signal, the gate of the seventh PMOS transistor being connected to an AND signal of the first pulse signal and the second pulse signal.

The source of the first PMOS transistor is connected to the source of the seventh NMOS transistor, with the timing control signal outputted after passing through an inverter.

The sources of the first PMOS transistor and the seventh NMOS transistor are also grounded through an eighth NMOS transistor, the gate of the eighth NMOS transistor being connected to an inverting signal of an AND signal of the first pulse signal and the second pulse signal.

The present invention, with three NMOS transistors connected in series between ground and a node of the bit line to which the each SRAM cell structures correspond, can increase the discharge speed of the corresponding bit line when the timing control signal is at a high level, and can reduce $T_{wl}$, i.e., the duration in which the wordline is at a high level during the read operation, by switching the first or second pulse signal to the falling edge after discharging the bit line, thus reducing the operational power consumption of SRAM.

Besides, in the present invention when the two ports asynchronously reads the SRAM cell structures of the same address simultaneously, the timing control signal is not always kept at a high level, and therefore over-adjustment of the discharge speed of the bit line, i.e. $T_{wl}$, can be avoided, which can ensure that the difference between the voltages before and after the bit line is read is kept to be greater than a certain value, thus avoiding the read operation reliability problem caused by insufficient difference between the voltages before and after the bit line is read. Therefore, the adjustment range of $T_{wl}$ of the present invention can be self-adapted to the asynchronous dual-port clock, with the read operation reliability ensured. Moreover, when the two ports asynchronously read the SRAM cell structures of the same address simultaneously, the read current is less than the read current when a port separately reads an address, and therefore the lower operational power consumption can be kept when the two ports read the same address simultaneously.

BRIEF DESCRIPTION OF THE DRAWINGS

The present invention will be further described below in detail with reference to drawings and specific embodiments.

DETAILED DESCRIPTION OF THE EMBODIMENTS

Figure 1:
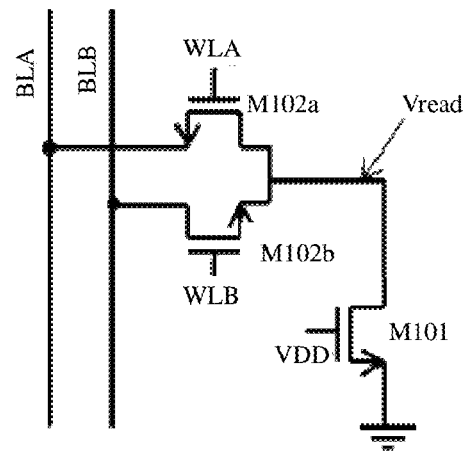
FIG. 1 is a prior art read-write schematic diagram of an existing dual-port SRAM.
Figure 2:
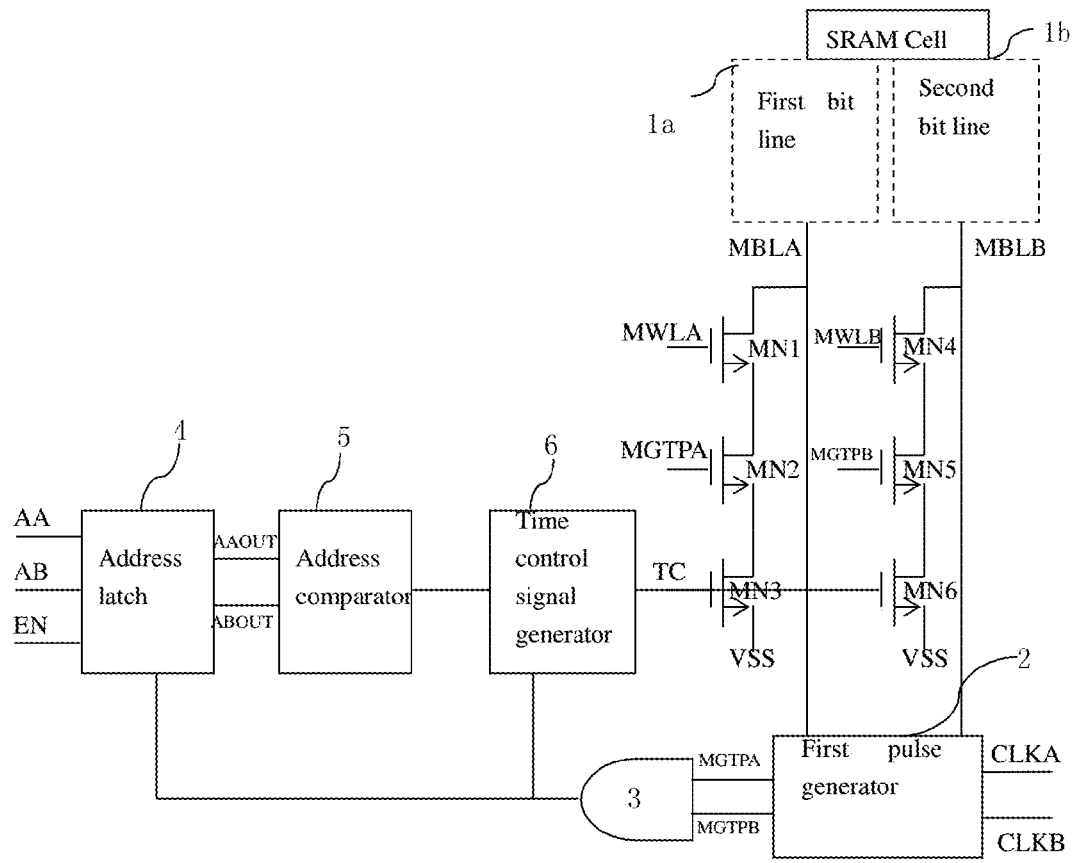
FIG. 2 is a diagram of the timing control circuit of the dual-port SRAM of an example of the present invention.

FIG. 2 is a diagram of the timing control circuit of the dual-port SRAM of the example of the present invention. The dual-port SRAM timing control circuit of the example of the present invention comprises:

A first port and a second port, through which the SRAM cell structure is read and written by two ports.

Each of the SRAM cell structures is connected to a first bit line 1a and a second bit line 1b; a first wordline and a second wordline, respectively; each of the first bit lines 1a and each of the first wordlines are connected to a first port, each of the second bit lines 1b and each of the second wordlines are connected to the second port. Wherein the first wordline is connected to a word signal MWLA, the second wordline is connected to a word signal MWLB; the first bit line 1*a* is connected to a bit signal MBLA, and the second line 1*b* is connected to a bit signal MBLB.

A first NMOS transistor MN1, a second NMOS transistor MN2 and a third NMOS transistor MN3 are connected in series between the ground VSS and a node of the first bit line 1*a* to which each SRAM cell structures corresponds, and a fourth NMOS transistor MN4, a fifth NMOS transistor MN5 and a sixth NMOS transistor MN6 are connected in series between the ground VSS and a node of the second bit line 1*b* to which each SRAM cell structures corresponds.

The gate of the first NMOS transistor MN1 is connected to the first wordline, the gate of the fourth NMOS transistor MN4 is connected to the second wordline; the gate of the second NMOS transistor MN2 is connected to a first pulse signal MGTPA, the gate of the fifth NMOS transistor MN5 is connected to a second pulse signal MGTPB. And both the gate of the third NMOS transistor MN3 and the gate of the fifth NMOS transistor MN5 are connected to a timing control signal TC.

A first clock signal CLKA and a first address signal AA are inputted from the first port, and a second clock signal CLKB and a second address signal AB are inputted from the second port.

The first clock signal CLKA and the second clock signal CLKB are inputted into the first pulse generator 2, forming the first pulse signal MGTPA and the second pulse signal MGTPB, respectively; the falling edge of the first pulse signal MGTPA is generated by a plurality of the SRAM cells discharging electricity toward the first bit line 1*a*, and the falling edge of the second pulse signal MGTPB is generated by a plurality of the SRAM cells discharging the second bit line 1*b*; the rising edge of the first pulse signal MGTPA being generated at the rising edge of the first clock signal CLKA, the rising edge of the second pulse signal MGTPB being generated at the rising edge of the second clock signal CLKB. Please refer to FIG. 4 for the sequential chart.

The first address signal AA and the second address signal AB, after respectively forming the signals AAOUT and ABOUT by passing through an address latch 4, are inputted into an address comparator 5 for comparison. The address comparator 5 outputs the address comparison result to a timing control signal generator 6; the first pulse signal MGTPA and the second pulse signal MGTPB, after undergoing an AND operation by passing through an AND gate 3, are inputted into the timing control signal generator 6. The timing control signal generator 6 outputs the timing control signal TC.

When the first address signal AA and the second address signal AB are the same, the address comparison result is 1; when the first address signal AA and the second address signal AB are not the same, the address comparison result is 0.

Figure 4:
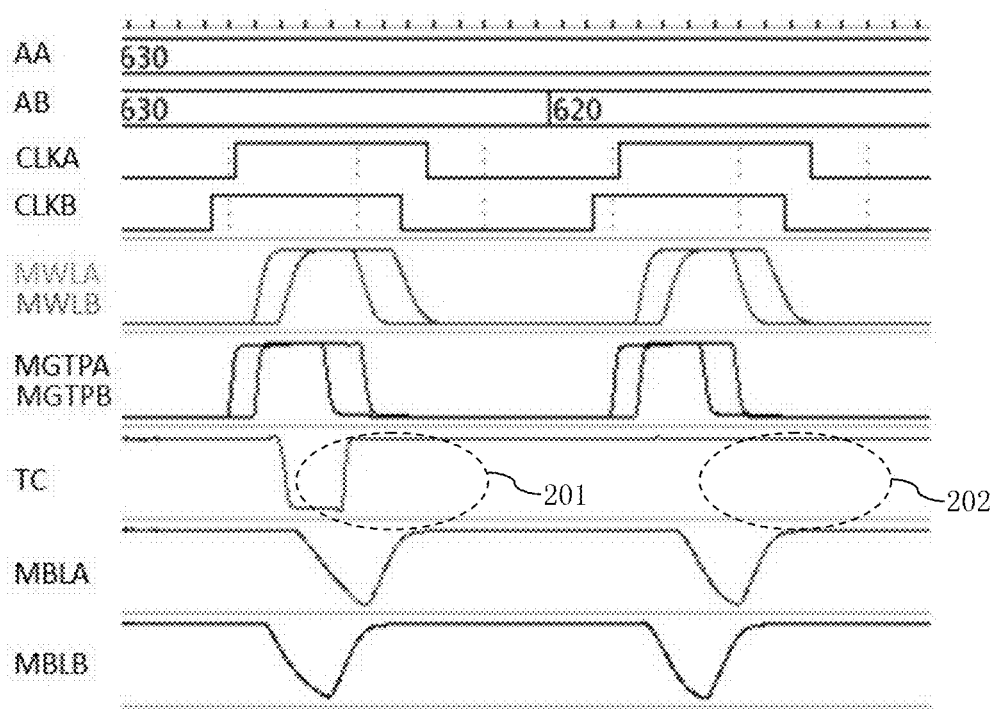
FIG. 4 is a simulation curve of the sequential signal of a preferred example of the present invention.

When the AND result of the first pulse signal MGTPA and the second pulse signal MGTPB is 0, the timing control signal TC is 1; when the AND result of the first pulse signal MGTPA and the second pulse signal MGTPB is 1, the timing control signal TC is 0, which is an inverting signal of the address comparison result. As shown in FIG. 4, in a position to which the dotted frame 201 corresponds, the first address signal AA and the second address signal AB are the same, and the address comparison result is 1; only when the AND result of the first pulse signal MGTPA and the second pulse signal MGTPB is 1, will the timing control signal TC be 0, i.e., an inverting result of the address comparison result. The timing control signal TC is 1 in all the other cases, including the position shown by the dotted frame 202.

The EN in FIG. 2 is an enable signal of the whole time control circuit. When the EN is in a high level, the time control circuit is active; otherwise, the time control circuit will be null (the TC signal is always in a low level).

In the example of the present invention, the first clock signal CLKA and the second clock signal CLKB are different in frequency and asynchronous in phase.

FIGS. 3A-3F are diagrams of the timing control circuit of the dual-port SRAM of the preferred example of the present invention. The preferred example of the present invention is specifically improved on the basis of the example as shown in FIG. 2.

Figure 3A:
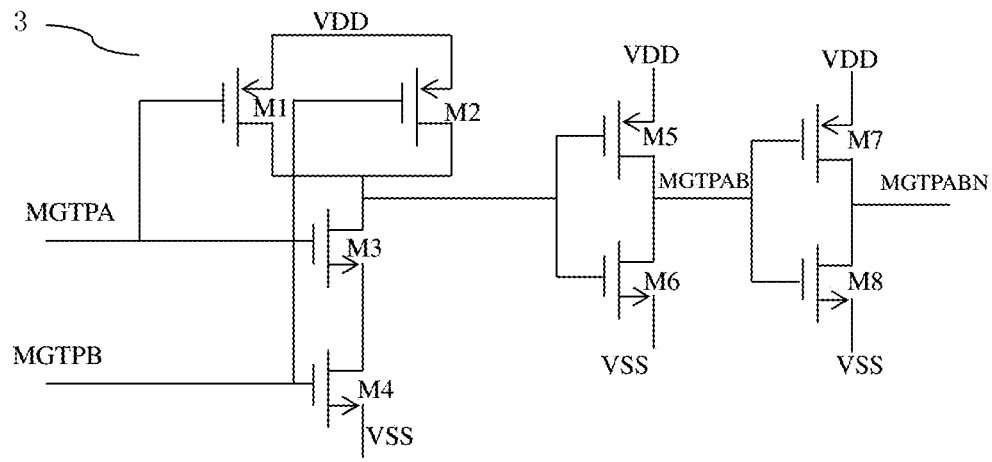
FIGS. 3A-3F are diagrams of the timing control circuit of the dual-port SRAM of preferred examples of the present invention.

As shown in FIG. 3A, the first pulse signal MGTPA and the second pulse signal MGTPB, after passing through the AND gate 3 composed of the MOS transistors M1, M2, M3, M4, M5, M6, M7 and M8, output an AND signal MGTPAB and an NAND signal MGTPABN, respectively.

Figure 3B:
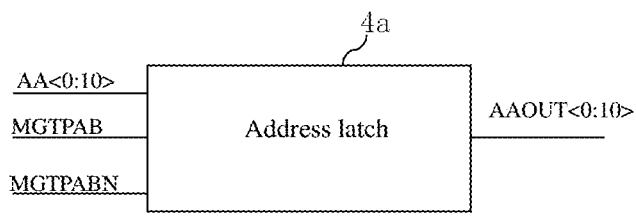
Figure 3C:
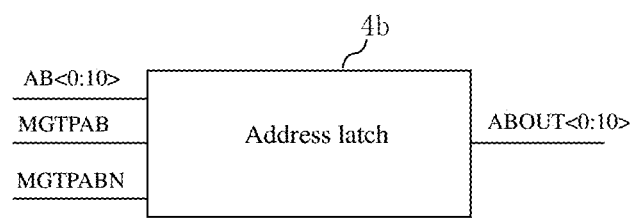

As shown in FIGS. 3B and 3C, the first address signal AA and the second address signal AB include 11 bits, respectively. The first address signal AA<0:10> outputs a latch signal AAOUT<0:10> after passing through an address latch 4*a*; the second address signal AB<0:10> outputs a latch signal ABOUT<0:10> after passing through an address latch 4*b*; the AND signal MGTPAB and the NAND signal MGTPABN are also inputted into the address latches 4*a* and 4*b*, respectively.

Figure 3D:
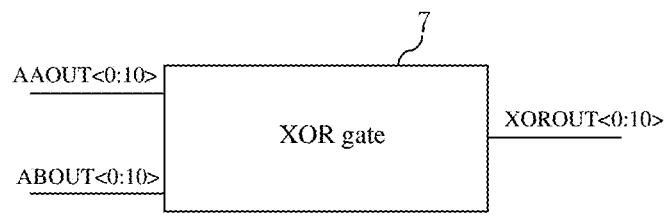

The address comparator 5 includes a plurality of XOR gates 7 and a plurality of NOR gates. As shown in FIG. 3D, the latch signals AAOUT<0:10> and ABOUT<0:10> are inputted into the XOR gate 7, respectively, and undergo the XOR processing for the same bits, respectively, with an address XOR signal XOROUT<0:10> formed and outputted.

Figure 3E:
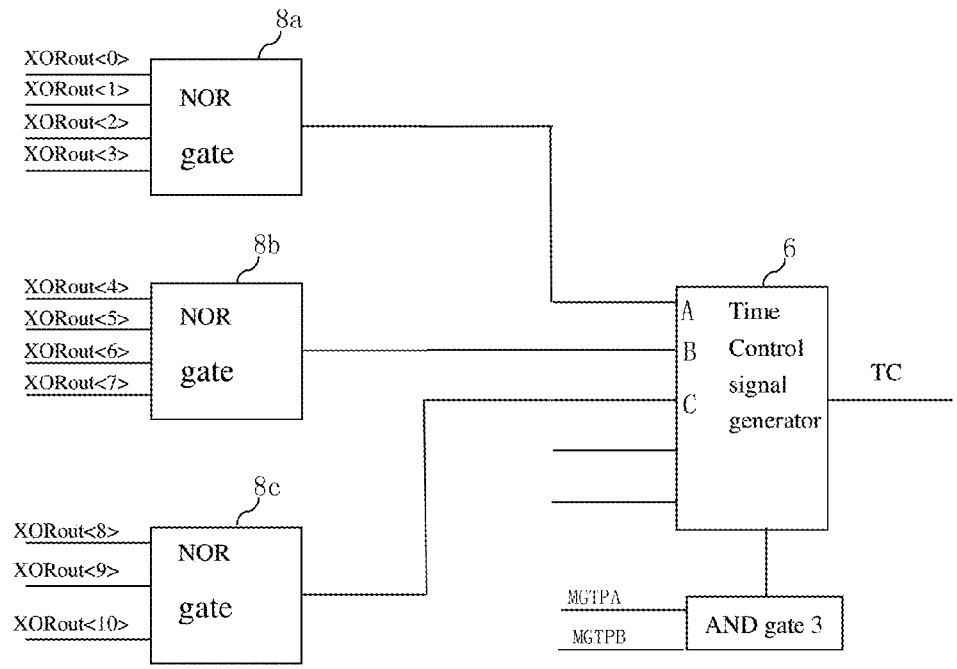

The each NOR gates perform an NOR operation on more than two bits of the address XOR signal XOROUT, respectively, and output the corresponding NOR operation result. As shown in FIG. 3E, an NOR gate 8*a* processes the front 4 bits of the address XOR signal XOROUT to form a signal A, an NOR gate 8*b* processes the next 4 bits of the address XOR signal XOROUT to form a signal B, and an NOR gate 8*c* processes the final 3 bits of the address XOR signal XOROUT to form a signal C.

An AND operation is performed on the NOR operation results outputted by the each NOR gates, i.e. the signals A, B and C, thus forming the address comparison result. As shown in FIG. 3E, the AND operational circuit is located in the timing control signal generator 6.

Figure 3F:
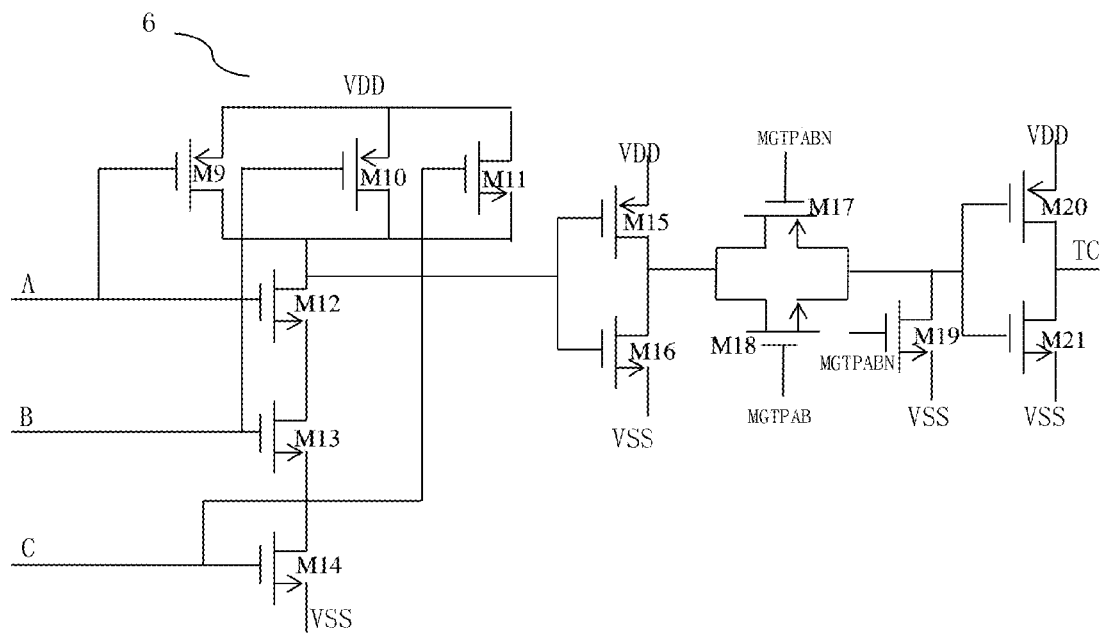

As shown in FIG. 3F, the timing control signal generator 6 in the preferred example of the present invention first includes an AND operational circuit, which is composed of MOS transistors M9, M10, M11, M12, M13, M14, M15 and M16. The drains of the MOS transistors M15 and M16 output the AND operation results of the signals A, B and C, i.e. the address comparison results.

The timing control signal generator 6 includes a transmission gate composed of a first PMOS transistor M17 and a seventh NMOS transistor M18, whose drains are both connected to the address comparison result. The gate of the first PMOS transistor M17 is connected to an inverting signal of an AND signal of the first pulse signal MGTPA and the second pulse signal MGTPB, i.e. the signal MGTPABN: the gate of the seventh PMOS transistor M18 being connected to an AND signal of the first pulse signal MGTPA and the second pulse signal MGTPB, i.e. the signal MGTPAB.

The source of the first PMOS transistor M17 is connected to the source of the seventh NMOS transistor M18, and output a timing control signal TC after passing through an inverter which, in a preferred example of the present invention, is composed of the MOS transistors M20 and M21.

The sources of the first PMOS transistor M17 and the seventh NMOS transistor M18 are also connected to the ground VSS through an eighth NMOS transistor M19. The gate of the eighth NMOS transistor M19 is connected to the signal MGTPABN.

FIG. 4 shows a simulation curve of the sequential signal of the preferred example of the present invention. The addresses of the address signals AA and AB in the previous period are the same, both being 630, and the address of the address signal AB in the next period is switched to 620. The clock signals clka and clkb are different in frequency and asynchronous in phase. The word signals mwla and mwlb are pulse signals, whose phase changes with the phase of the pulse signals mgtpa and mgtpb. The pulse signals mgtpa and mgtpb form a rising edge of the pulse signal at the rising edge of the clock signals clka and clkb, respectively. The falling edge of the pulse signals mgtpa and mgtpb is generated by discharging the bit line signals mbla and mblb. The clock control signal tc is determined by the AND result of the pulse signals mgtpa and mgtpb, and the structure of the address signals AA and AB. In FIG. 4, a low-level pulse appears at the dotted frame 201 while a high level in all the other positions. The bit line signals mbla and mblb discharge under the control of the word signals mwla and mwlb, the pulse signals mgtpa and mgtpb, and the clock control signal tc, respectively.

When the clock control signal tc is at a high level, the bit line signals mbla and mblb discharge at high speed; when the clock control signal tc is at a low level, the bit line signals mbla and mblb discharge at low speed. Therefore, the discharge speed of the bit line signals mbla and mblb is adjusted by the level of the clock control signal tc in the example of the present invention.

As shown in FIG. 4, the discharge speed of the bit line signals mbla and mblb at the dotted frame 201 is lower than that at the dotted frame 202. At the dotted frame 202, the addresses read by the two ports are different, and here the falling edge of the pulse signals mgtpa and mgtpb can be made to appear earlier by increasing the discharge speed of the bit line signals mbla and mblb; after the falling edge of the pulse signals mgtpa and mgtpb appears, the discharge path of the bit line signals mbla and mblb is then closed, i.e., the path of the three NMOS transistors between the bit line node and ground is not on, which is also equivalent to that the duration when the word signals mwla and mwlb are at a high level, i.e. $T_{wl}$, is shortened, thus reducing the operational power consumption of SRAM.

At the dotted frame 201, the two ports read the same address, in this case the clock control signal tc of part time in the example of the present invention is set to be at a low level. When the clock control signal tc at a low level, the discharge speed of a discharge branch of the corresponding bit line will not be adjusted to be higher, which makes the falling edge of the pulse signals mgtpa and mgtpb appear later and keeps $T_{wl}$ at a sufficiently large value. It thus prevents reduced reliability of the read operation caused by the too small difference between the voltages before and after the bit line is read when $T_{wl}$ is smaller in this case, i.e., the voltage difference before and after the bit line is read can be kept to be greater than a minimum value. That is, except when the clock control signal tc processed by the present invention is at a low level, all the other cases are in a mode of saving power consumption.

The signal sd in FIG. 4 is a signal that enters a sensitive amplifier when the cell structure of SRAM operates.

Figure 5A:
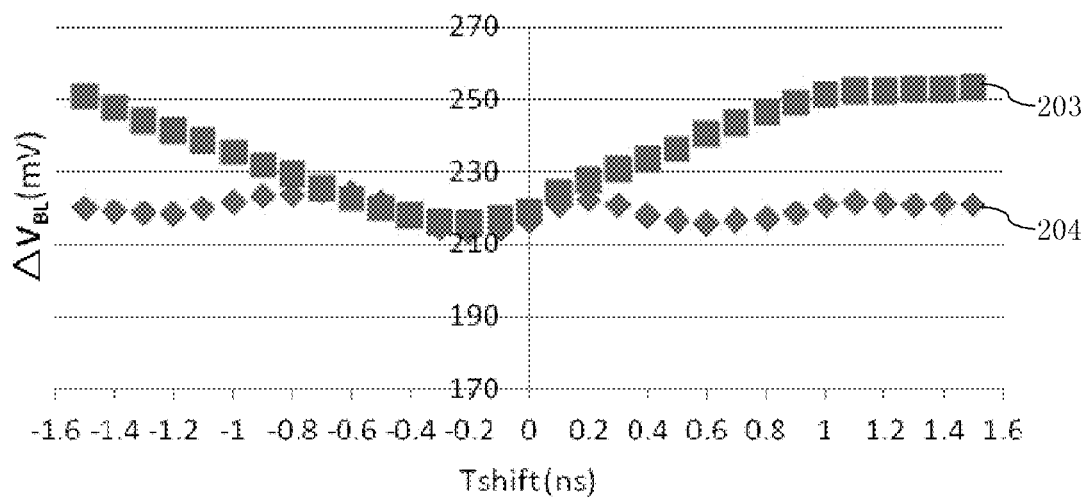
FIG. 5A shows the comparison of the bit line voltage difference curve and the clock signal deviation curve between a preferred circuit of the present invention and the existing read-write circuit.
Figure 5B:
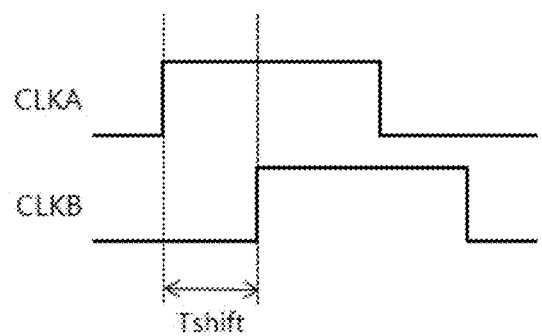
FIG. 5B is a schematic diagram of the clock signal deviation in FIG. 5A.

FIG. 5A is a comparison of the bit line voltage difference curve and the clock signal deviation curve between the circuit of the preferred embodiment of the present invention and the existing read-write circuit. The curve 203, shown as shaded symbols □, is a curve of the bit line voltage difference, i.e., $\Delta V_{BL}$(mV), of the existing read-write circuit changing with the clock signal deviation, i.e., Tshift (ns); and the curve 204, shown as shaded symbols ◇, is a curve of the bit line voltage difference of the circuit of the preferred example of the present invention changing with the clock signal deviation. It can be known that the bit line voltage difference of the example of the present invention is not only reduced, but also no less than the minimum value; therefore, the example of the present invention can not only reduce the power consumption, but also keep the reliability. As shown in FIG. 5B, the clock signal deviation T shift is a phase deviation between the clock signals CLKA and CLKB. Therefore, the circuit of the example of the present invention not only reduces the operational power consumption, but also makes the adjustment range of $T_{wl}$ self-adapted to the asynchronous dual-port clock, thus ensuring the read operation reliability.

The present invention is described above in detail through specific examples, which, however, do not restrict the present invention. Without departing from the principle of the present invention, those skilled in the art may also make many variations and improvements, which should also be considered to be within the scope of protection of the present invention.

What is claimed is:

1. A dual-port SRAM timing control circuit, comprising:
a first NMOS transistor, a second NMOS transistor and a third NMOS transistor are connected in series between ground and a node of a first bit line to which each SRAM cell structures correspond; a fourth NMOS transistor, a fifth NMOS transistor and a sixth NMOS transistor are connected in series between ground and a node of a second bit line to which structures of each SRAM cell correspond;
a gate of the first NMOS transistor is connected to a first wordline, a gate of the fourth NMOS transistor is connected to a second wordline, a gate of the second NMOS transistor is connected to a first pulse signal, a gate of the fifth NMOS transistor is connected to a second pulse signal, and both a gate of the third NMOS transistor and a gate of the fifth NMOS transistor are connected to a timing control signal;
a first clock signal and a first address signal are inputted from a first port, and a second clock signal and a second address signal are inputted from a second port;
the first clock signal and the second clock signal are inputted into a first pulse generator, forming a first pulse signal and a second pulse signal, respectively; a falling edge of the first pulse signal is generated by a plurality of the SRAM cells discharging electricity toward the first bit line, and a falling edge of the second pulse signal is generated by a plurality of the SRAM cells discharging the second bit line, a rising edge of the first pulse signal being generated at the rising edge of the first clock signal, a rising edge of the second pulse signal being generated at the rising edge of the second clock signal;

the first address signal and the second address signal, after being latched by an address latch, are inputted into an address comparator for comparison, which outputs the address comparison result to a timing control signal generator; the first pulse signal and the second pulse signal, after undergoing an AND operation, are inputted into the timing control signal generator, which outputs the timing control signal;

when the first address signal is identical with the second address signal, the address comparison result is 1; when the first address signal is different from the second address signal, the address comparison result is 0; and when the AND result of the first pulse signal and the second pulse signal is 0, the timing control signal is 1; when the AND result of the first pulse signal and the second pulse signal is 1, the timing control signal is an inverting signal of the address comparison result.

2. The dual-port SRAM timing control circuit according to claim 1, wherein the first clock signal and the second clock signal are different in frequency and asynchronous in phase.

3. The dual-port SRAM timing control circuit according to claim 1, wherein the address comparator includes a plurality of XOR gates, and a plurality of NOR gates;

each of the XOR gates perform an XOR operation on each of same bits of the first address signal and the second address signal, respectively, and output an address XOR signal composed of XOR value of each bits;

each of the NOR gates perform an NOR operation on more than two bits of the address XOR signal, respectively, and output the corresponding NOR operation result; and an AND operation is performed on the NOR operation result outputted by each NOR gates to form the address comparison result.

4. The dual-port SRAM timing control circuit according to claim 1, wherein the timing control signal generator includes a transmission gate composed of a first PMOS transistor and a seventh NMOS transistor, whose drains are both connected to the address comparison result, the gate of the first PMOS transistor being connected to an inverting signal of an AND signal of the first pulse signal and the second pulse signal, the gate of the seventh PMOS transistor being connected to an AND signal of the first pulse signal and the second pulse signal;

the source of the first PMOS transistor is connected to the source of the seventh NMOS transistor, with the timing control signal outputted after passing through an inverter; and the sources of the first PMOS transistor and the seventh NMOS transistor are also grounded through an eighth NMOS transistor, the gate of the eighth NMOS transistor being connected to an inverting signal of an AND signal of the first pulse signal and the second pulse signal.

* * * * *